(12) United States Patent
Liou

(10) Patent No.: US 9,871,001 B2
(45) Date of Patent: Jan. 16, 2018

(54) FEEDING OVERLAY DATA OF ONE LAYER TO NEXT LAYER FOR MANUFACTURING INTEGRATED CIRCUIT

(71) Applicant: UNITED MICROELECTRONICS CORP., Hsin-Chu (TW)

(72) Inventor: En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/145,789

(22) Filed: May 3, 2016

(65) Prior Publication Data

US 2017/0323854 A1 Nov. 9, 2017

(51) Int. Cl.
  *H01L 21/66* (2006.01)
  *H01L 23/544* (2006.01)
  *H01L 21/027* (2006.01)
  *H01L 21/308* (2006.01)

(52) U.S. Cl.
  CPC ........ *H01L 23/544* (2013.01); *H01L 21/0274* (2013.01); *H01L 21/3086* (2013.01); *H01L 22/10* (2013.01); *H01L 2223/54426* (2013.01)

(58) Field of Classification Search
  CPC ......... H01L 23/544; H01L 2223/54426; H01L 21/027; H01L 21/266; H01L 21/308; H01L 21/3081; H01L 21/31144; H01L 21/32139; H01L 21/823425; H01L 21/7682; H01L 21/76885; H01L 21/76897; H01L 21/823475; H01L 29/42364; H01L 29/6653; H01L 29/66545; H01L 29/66628; H01L 29/785; G03F 7/70633; G03F 9/7046; G03F 9/7065; G03F 9/7088; G03F 9/7092
  USPC ......................................................... 438/14
  See application file for complete search history.

(56) References Cited

U.S. PATENT DOCUMENTS

| | | | |
|---|---|---|---|
| 8,767,183 B2 | 7/2014 | Den Boef | |
| 9,134,625 B2 | 9/2015 | Padiy | |
| 2010/0321654 A1* | 12/2010 | Den Boef | G03F 7/70633 355/53 |
| 2014/0111779 A1* | 4/2014 | Chen | G03F 7/70633 355/27 |
| 2015/0019192 A1* | 1/2015 | Habets | G03F 7/705 703/14 |
| 2015/0021683 A1* | 1/2015 | Xie | H01L 29/6653 257/330 |

\* cited by examiner

*Primary Examiner* — Duy T Nguyen
(74) *Attorney, Agent, or Firm* — Winston Hsu

(57) ABSTRACT

A method of manufacturing an integrated circuit includes the following steps. A substrate including a plurality of exposure fields is provided, and each of the exposure fields includes a target portion and a set of overlay marks. The substrate is exposed to form a first layer lithography pattern on the target portion for the respective exposure field by an exposure system. The overlay of the first layer lithography pattern and the target portion is measured by the set of overlay marks of each exposure field to obtain first overlay data for the respective exposure field by a measuring system. The first overlay data is fed to form a second layer lithography pattern.

17 Claims, 4 Drawing Sheets

FEEDING OVERLAY DATA OF ONE LAYER TO NEXT LAYER FOR MANUFACTURING INTEGRATED CIRCUIT

BACKGROUND OF THE INVENTION

1. Field of the Invention

The present invention relates generally to a method of manufacturing an integrated circuit, and more specifically to a method of manufacturing an integrated circuit feeding an overlay data of a layer to a next layer as an alignment data.

2. Description of the Prior Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle may be used to generate a circuit pattern to be formed on an individual layer of the IC. This pattern can be transferred onto a target portion. Transferring of the pattern is typically via imaging onto a layer of radiation-sensitive material (resist) provided on the substrate. In general, a single substrate will contain a network or adjacent target portions that are successively patterned with a lithographic apparatus, in which each target portion is irradiated by scanning the pattern through a radiation beam in a given direction.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Devices are built up layer by layer and overlay is a measure of a lithographic apparatus' ability to print these layers accurately on top of each other. Successive layers or multiple processes on the same layer must be accurately aligned to the previous layer, otherwise electrical contact between structures will be poor and the resulting devices will not perform to specification. Overlay is a measure of the accuracy of this alignment. Good overlay improves device yield and enables smaller product patterns to be printed. The overlay error between successive layers formed in or on the patterned substrate is controlled by various parts of the exposure apparatus (of the lithographic apparatus). It is mostly the alignment system of the lithographic apparatus that is responsible for the alignment of the radiation onto the correct portions of the substrate.

With the miniaturization of integrated circuits, it becomes a critical challenge to form a desired pattern as well as forming it on a specific position by a lithography process. Consequently, modern lithography apparatuses involve extensive measurement. These operations, being time-consuming, limit the throughput of the lithography apparatus, and consequently increase the unit cost of the semiconductor or other products, specifically as pattern features become smaller and overlay performance requirements become ever more demanding. Therefore, an improved method being time-saving, accurate measuring, simulating and correcting of patterns actually printed on a substrate is urged in current industry.

SUMMARY OF THE INVENTION

The present invention provides a method of manufacturing an integrated circuit, which includes measuring the overlay of a pre-layer lithography pattern on a substrate to form an overlay data, and then feeds the overlay data to form the layer lithography pattern.

The present invention provides a method of manufacturing an integrated circuit including the following steps. A substrate including a plurality of exposure fields is provided, and each of the exposure fields includes a target portion and a set of overlay marks. The substrate is exposed to form a first layer lithography pattern on the target portion for the respective exposure field by an exposure system. The overlay of the first layer lithography pattern and the target portion is measured by the set of overlay marks of each exposure field to obtain first overlay data for the respective exposure field by a measuring system. The first overlay data is fed to form a second layer lithography pattern.

According to the above, the present invention provides a method of manufacturing an integrated circuit, which exposes a substrate to forma first layer lithography pattern on a target portion, measures the overlay of the first layer lithography pattern and the target portion by a set of overlay marks of each exposure field of the substrate to form a first overlay data, and then feeds the first overlay data to form a second layer lithography pattern. Thus, not only point overlay, but also deformations, rotations, shiftings of overlay or so on in each of the exposure fields can be shown in the first overlay data, and the second layer lithography pattern can be adjusted before being printed, thereby integrated circuits can be formed accurately and quickly, with low cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
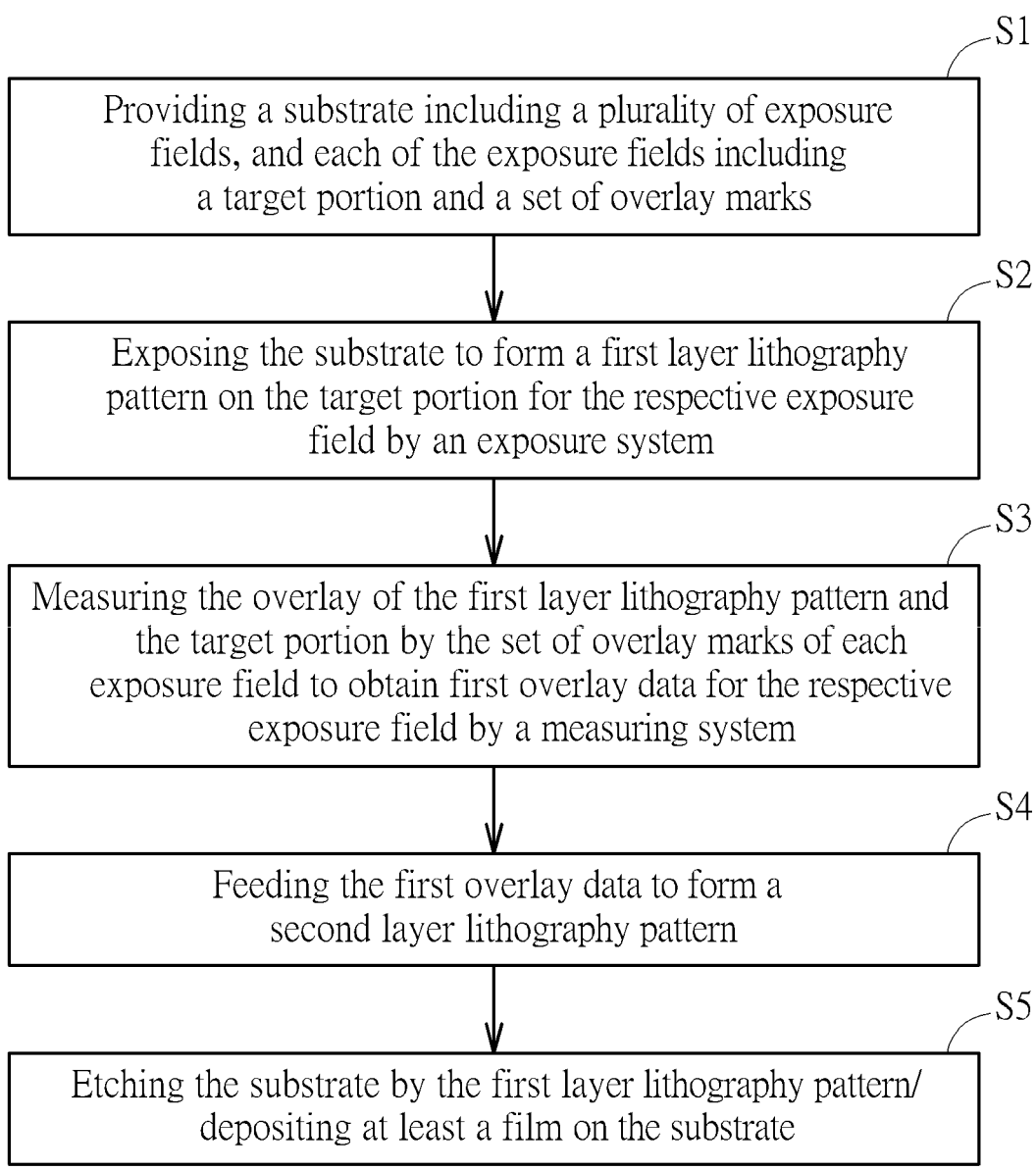
FIG. 1 schematically depicts a flow chart of a method of manufacturing an integrated circuit according to an embodiment of the present invention.
Figure 2:
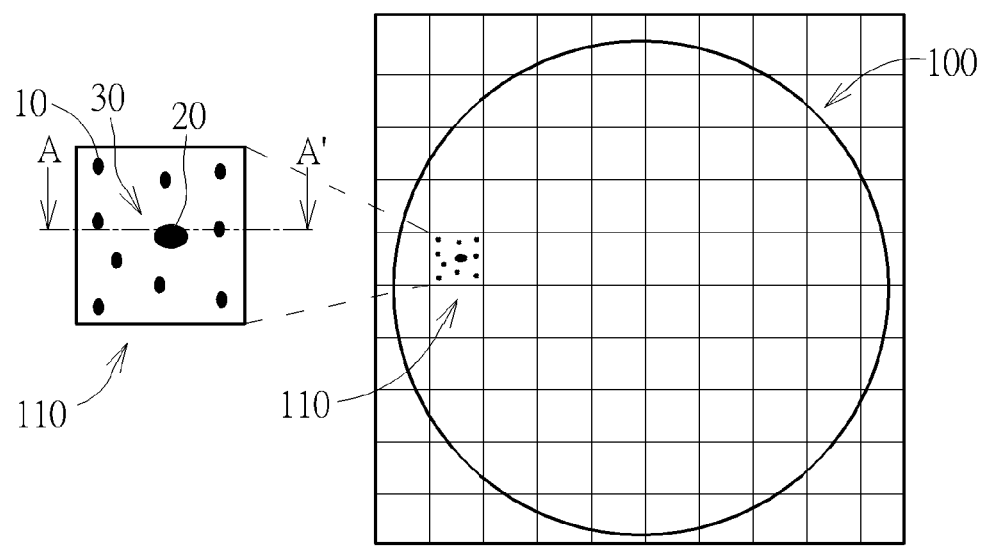
FIG. 2 schematically depicts a top view of a set of overlay marks on each exposure field of a substrate according to an embodiment of the present invention.
Figure 3:
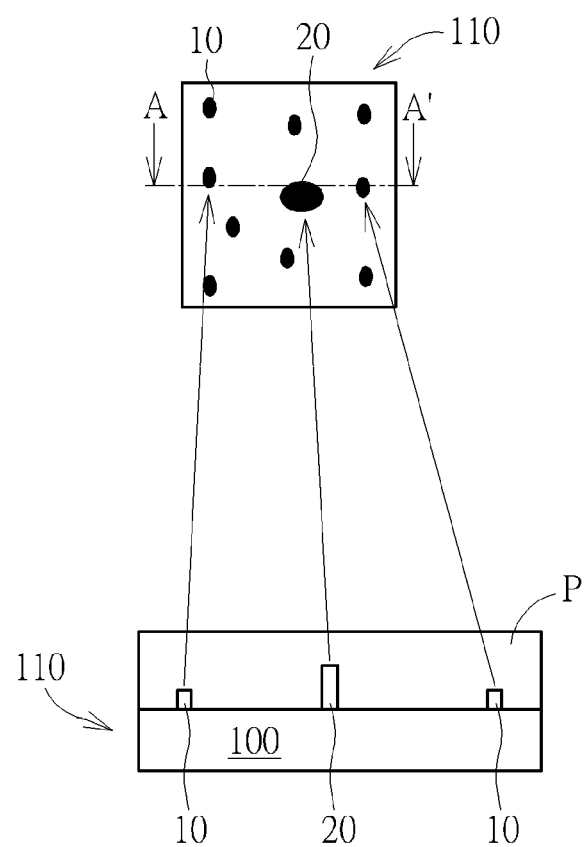
FIG. 3 schematically depicts a cross-sectional view of a set of overlay marks on an exposure field of FIG. 2.

FIG. 1 schematically depicts a flow chart of a method of manufacturing an integrated circuit according to an embodiment of the present invention. FIG. 2 schematically depicts a top view of a set of overlay marks on each exposure field of a substrate according to an embodiment of the present invention. FIG. 3 schematically depicts a cross-sectional view of a set of overlay marks on an exposure field of FIG. 2.

Refer to step S1 of FIG. 1: providing a substrate including a plurality of exposure fields (which may correspond to each die area), and each of the exposure fields including a target portion and a set of overlay marks (which may be positioned on a scribe line). As shown in FIG. 2, a substrate 100 may include a plurality of exposure fields 110, wherein each exposure field 110 may include alignment marks and overlay marks, and the numbers of alignment marks and overlay marks are not restricted. In this embodiment, each of the exposure fields 110 may include a set of overlay marks 10 including a plurality of overlay marks, one single alignment mark 20 and a target portion 30. Thereby, the alignment measurement step can be simplified and time-saving due to one single alignment mark 20 measurement, while the overlay measurement step can be accurate; such that specific points in the substrate 100 as well as deviations including deformations, rotations, shiftings or so on can be measured, due to intra-field, meaning the set of overlay marks 10 including a plurality of overlay marks, being measured. In this case, the alignment mark 20 is positioned at the center of each of the exposure fields 110 for measuring the center position of each of the exposure fields 110, which represents this exposure field 110, while the set of overlay marks 10 is distributed around the alignment mark 20 for measuring each of the exposure fields 110 uniformly and exhaustively, but it is not limited thereto. The number and the distribution of the set of overlay marks 10 and the alignment mark 20 in each of the exposure fields 110 are not restricted thereto. It is emphasized that, since intra-field, meaning the set of overlay marks 10 including a plurality of overlay marks, is measured, not only point positions but also deformations, rotations, shiftings or so on of each of the exposure fields 110 can be obtained by measuring absolute positions, relative positions, relative distances, relative angles or so on of overlay marks included in the set of overlay marks 10. Furthermore, the set of overlay marks 10 may be in all of the exposure fields 110 of the substrate 110, or the set of overlay marks 10 may be just in some of the exposure fields 110 of the substrate 110, thereby only these exposure fields 110 in specific/selected positions are analyzed with multi-points. Hence, this reduces operation time and increases processing efficiency. In a preferred embodiment, these exposure fields 110 having the set of overlay marks 10 therein are distributed symmetric from a center point, but it is not limited thereto.

Furthermore, the cross-sectional view of the set of overlay marks 10 and the alignment mark 20 alone AA' line of FIG. 2 is shown in FIG. 3. The set of overlay marks 10 and the alignment mark 20 are disposed on each exposure field 110 of the substrate 110, wherein the overlay marks included in the set of overlay marks 10 may be different from the alignment mark 20 for recognizing. A photoresist P may cover the substrate 100 including the set of overlay marks 10 and the alignment mark 20 for sequential lithography patterning processes, but it is not limited thereto.

Refer to step S2 of FIG. 1: exposing the substrate to form a first layer lithography pattern on the target portion for the respective exposure field by an exposure system. The substrate 100 is exposed, thereby a first layer lithography pattern being on the target portion 30, meaning the photoresist P being lithographically patterned and thus parts of the substrate 100 being exposed without etching yet.

Refer to step S3 of FIG. 1: measuring the overlay of the first layer lithography pattern and the target portion by the set of overlay marks of each exposure field to obtain first overlay data for the respective exposure field by a measuring system. The set of overlay marks 10 of each exposure field 110 is measured by a measuring system to obtain first overlay data, thereby the overlay of the first layer lithography pattern and the target portion being obtained. The first overlay data can show the overlay of each point of the substrate 100 corresponding to the absolute positions of the overlay marks of the set of overlay marks 10. It is emphasized that deformations, rotations, shiftings of overlay or so on in each of the exposure fields 110 can also be obtained by the relative parameters of the set of overlay marks 10 such as relative positions, relative distances, relative angles or so on of the overlay marks of the set of overlay marks 10. Hence, not only point overlay, but also deformations, rotations, shiftings of overlay or so on in each of the exposure fields 110 can be obtained. Thus, a next substrate or a next exposure can be adjusted before exposed according to the first overlay data, thereby integrated circuits can be formed accurately and quickly, with low cost.

Refer to step S4 of FIG. 1: feeding the first overlay data to form a second layer lithography pattern. The first overlay data is then fed to form a second layer lithography pattern. Thereby, the second layer lithography pattern can be formed by exposing the substrate 100 according to the first overlay data to make processes precise and with low cost. In one case, the first overlay data may be utilized as an alignment data. In another case, an alignment data for forming the second layer lithography pattern may be obtained before the substrate 100 is exposed, and then the first overlay data and the alignment data are re-calculated to form the second layer lithography pattern. Preferably, the first overlay data and the alignment data of the second layer lithography pattern may be utilized with different weightings, depending upon practical requirements. The first layer lithography pattern and the second layer lithography pattern may be formed in different layers. For example, the first layer lithography pattern is a gate pattern while the second layer lithography pattern is a contact pattern, but it is not limited thereto. In this embodiment, the first overlay data is fed to form the second layer lithography pattern right after obtaining the first overlay data; that is, the step S3 of FIG. 1: measuring the overlay of the first layer lithography pattern and the target portion by the set of overlay marks of each exposure field to obtain first overlay data for the respective exposure field by a measuring system. However, the first overlay data may be fed to form the second layer lithography pattern in other (later) steps before the second layer lithography pattern being formed.

Furthermore, the first overlay data may be fed to form the second layer lithography pattern with different weightings in different directions for different process or device tolerances. In a preferred embodiment, the directions may include a first direction and a second direction, and the first direction is orthogonal to the second direction.

Refer to step S5 of FIG. 1: etching the substrate by the first layer lithography pattern/depositing at least a film on the substrate. After the step S3 of FIG. 1: measuring the overlay of the first layer lithography pattern and the target portion by the set of overlay marks of each exposure field to obtain first overlay data for the respective exposure field by a measuring system, or the step S4 of FIG. 1: feeding the first overlay data to form a second layer lithography pattern, the substrate 100 is processed with etching, depositing, implanting, planarizing, or so on. For instance, the substrate 110 is etched by the first layer lithography pattern to complete the photolithography and etching process, and then the photoresist P may be removed. Moreover, at least a film may then be deposited on the substrate 110; some areas of the substrate 110 may be implanted to form wells, source/drains or others; some areas of the substrate 110 may be planarized to form layers having flat top surfaces, plugs or others.

Moreover, after the step S5 of FIG. 1: etching the substrate by the first layer lithography pattern/depositing at least a film on the substrate is carried out, meaning a first layer being complete, a second layer is processed by the second layer lithography pattern. The second layer overlaps the first layer, thereby the first overlay data can be fed to form the second layer lithography pattern.

Figure 4:
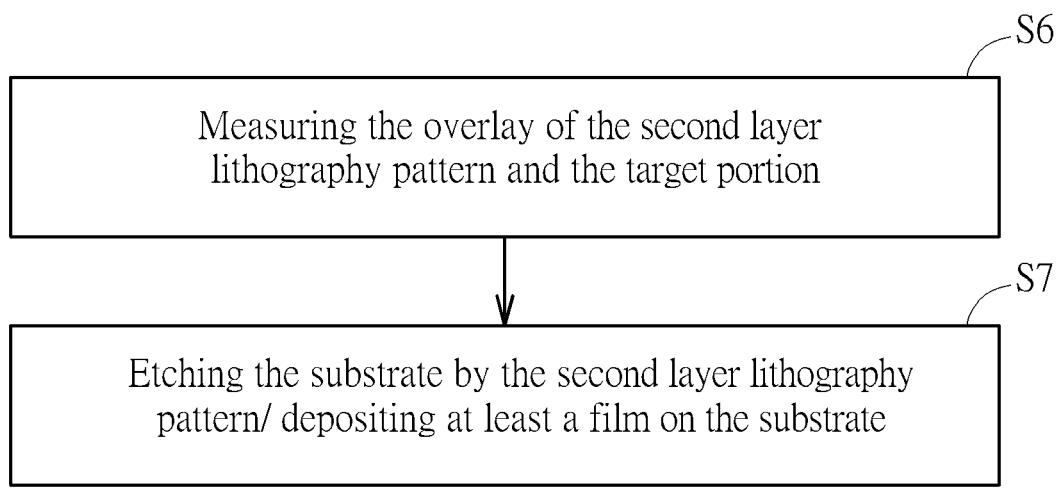
FIG. 4 schematically depicts a flow chart of a method of manufacturing an integrated circuit according to an embodiment of the present invention.

More precisely, FIG. 4, which schematically depicts a flow chart of a method of manufacturing an integrated circuit according to an embodiment of the present invention, shows the steps processing the second layer. Refer to step S6 of FIG. 1: measuring the overlay of the second layer lithography pattern and the target portion. After the substrate 110 is exposed to form the second layer lithography pattern, the overlay of the second layer lithography pattern and the target portion 30 is measured. Methods of measuring the overlay of the second layer lithography pattern and the target portion may be similar to the step S3 of FIG. 1: measuring the overlay of the first layer lithography pattern and the target portion by the set of overlay marks of each exposure field to obtain first overlay data for the respective exposure field by a measuring system. Thereby, the second overlay data is obtained. The second overlay data can be fed to a next substrate or a next exposure as well. And then, refer to step S7 of FIG. 1: etching the substrate by the second layer lithography pattern/depositing at least a film on the substrate. Methods of etching the substrate by the second layer lithography pattern/depositing at least a film on the substrate may be similar to the step S5 of FIG. 1: etching the substrate by the first layer lithography pattern/depositing at least a film on the substrate.

Figure 5:
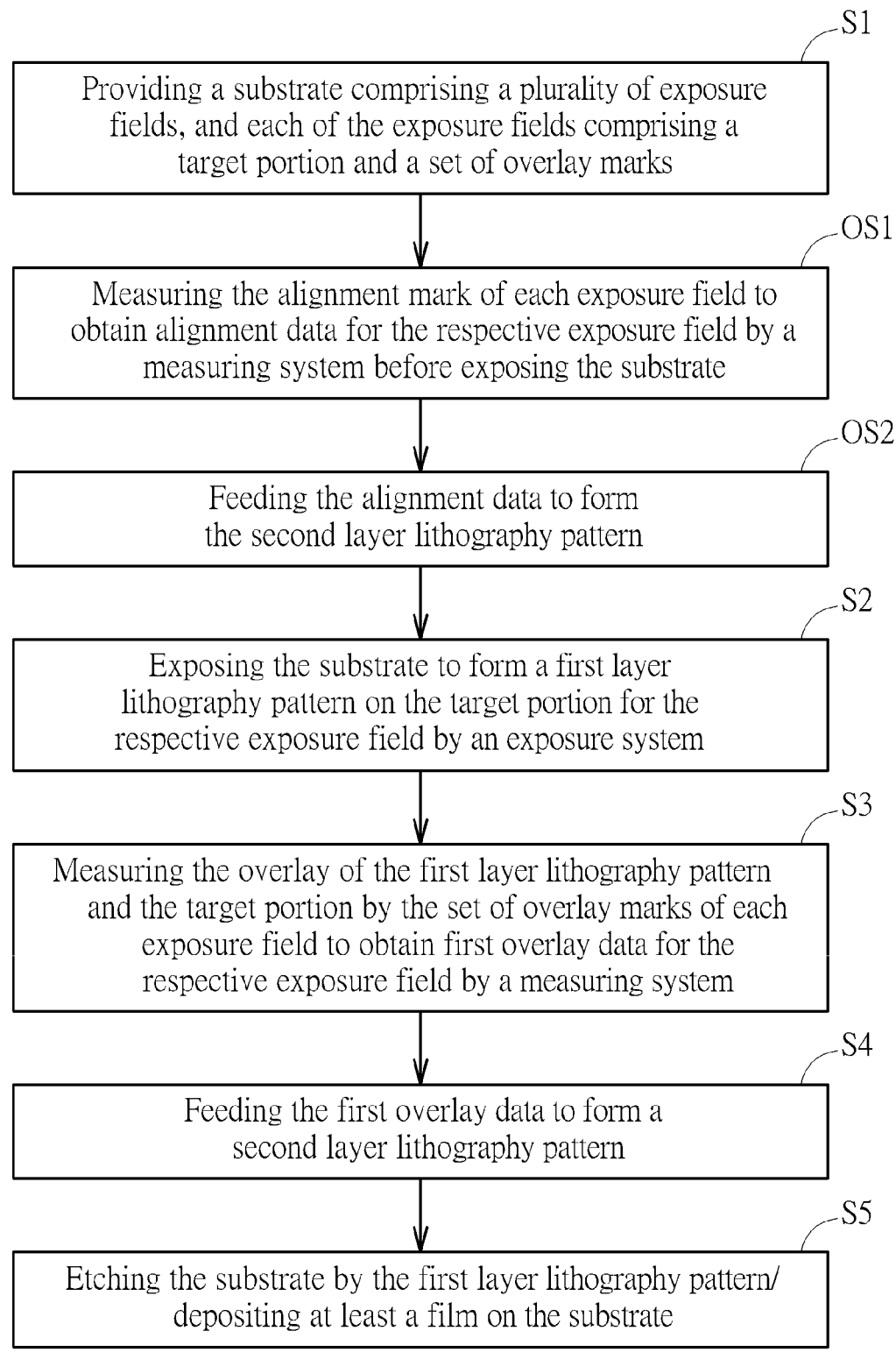
FIG. 5 schematically depicts a flow chart of a method of manufacturing an integrated circuit according to an embodiment of the present invention.

Moreover, before the step S2 of FIG. 1: exposing the substrate to form a first layer lithography pattern on the target portion for the respective exposure field by an exposure system is carried out, an alignment measurement may be processed previously. FIG. 5 schematically depicts a flow chart of a method of manufacturing an integrated circuit according to an embodiment of the present invention. Refer to step OS1 of FIG. 1: measuring the alignment mark of each exposure field to obtain alignment data for the respective exposure field by a measuring system before exposing the substrate. As shown in FIGS. 2-3, one single alignment mark 10 of each exposure field 110 is measured by a measuring system to obtain alignment data. The alignment data can show the alignment of each point of the substrate 100 corresponding to the absolute positions of the alignment mark 10. Then, the first layer lithography pattern can be formed according to the alignment data, meaning the photoresist P being lithographically patterned and thus parts of the substrate 100 being exposed according to the alignment data. Thus, the first layer lithography pattern can be formed accurately.

Furthermore, refer to step OS2 of FIG. 1: feeding the alignment data to form the second layer lithography pattern. The alignment data not only can be used to form the first layer lithography pattern, but also can be used to form the second layer lithography pattern. Preferably, the first overlay data and the alignment data are utilized with different weightings to form the second layer lithography pattern. Still preferably, the first overlay data, the alignment data of the first layer lithography pattern and the alignment data of the second layer lithography pattern are utilized with different weightings to form the second layer lithography pattern more accurately, depending upon practical requirements.

To summarize, the present invention provides a method of manufacturing an integrated circuit, which exposes a substrate to form a first layer lithography pattern on a target portion, measures the overlay of the first layer lithography pattern and the target portion by a set of overlay marks of each exposure field of the substrate to form a first overlay data, and then feeds the first overlay data to form a second layer lithography pattern. Thus, not only point overlay, but also deformations, rotations, shiftings of overlay or so on in each of the exposure fields can be shown in the first overlay data, and the second layer lithography pattern can be adjusted before being printed, thereby integrated circuits can be formed accurately and quickly, with low cost.

The first overlay data can directly be an alignment data to form the second layer lithography pattern, or the first overlay data and an alignment data of the second layer lithography pattern can be re-calculated (with different weightings preferably) to form the second layer lithography pattern. Besides, the first overlay data may be fed to form the second layer lithography pattern with different weightings in different directions, such as a first direction orthogonal to a second direction.

Moreover, the substrate may include an alignment mark, so that the alignment mark of each exposure field can be measured to obtain alignment data for the respective exposure field before exposing the substrate. Thus, the alignment mark not only can be used to form the first layer lithography pattern, but also can be used to form the second layer lithography pattern. As the alignment mark is used to form the second layer lithography pattern, the first overlay data and the alignment data may be utilized with different weightings to form the second layer lithography pattern; or the first overlay data, the alignment data of the first layer lithography pattern and the alignment data of the second layer lithography pattern may be utilized with different weightings to form the second layer lithography pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an integrated circuit, comprising:

providing a substrate comprising a plurality of exposure fields, and each of the exposure fields comprising a target portion and a set of overlay marks;

exposing the substrate to form a first layer lithography pattern on the target portion for the respective exposure field by an exposure system;

measuring an overlay of the first layer lithography pattern and the target portion by the set of overlay marks of each exposure field to obtain first overlay data for the respective exposure field by a measuring system; and feeding the first overlay data to form a second layer lithography pattern with different weightings in different directions by the measuring system, wherein the first layer lithography pattern and the second layer lithography pattern are formed in different layers.

2. The method of manufacturing the integrated circuit according to claim 1, further comprising:
feeding the first overlay data as an alignment data to form the second layer lithography pattern.

3. The method of manufacturing the integrated circuit according to claim 1, further comprising:
re-calculating the first overlay data and an alignment data of the second layer lithography pattern to form the second layer lithography pattern.

4. The method of manufacturing the integrated circuit according to claim 3, wherein the first overlay data and the alignment data of the second layer lithography pattern are utilized with the different weightings.

5. The method of manufacturing previously presented the integrated circuit according to claim 1, further comprising:
etching the substrate by the first layer lithography pattern after measuring the overlay of the first layer lithography pattern and the target portion.

6. The method of manufacturing the integrated circuit according to claim 1, further comprising:
depositing at least a film on the substrate after measuring the overlay of the first layer lithography pattern and the target portion.

7. The method of manufacturing the integrated circuit according to claim 1, further comprising:
measuring an overlay of the second layer lithography pattern and the target portion.

8. The method of manufacturing the integrated circuit according to claim 7, further comprising:
etching the substrate by the second layer lithography pattern after measuring the overlay of the second layer lithography pattern and the target portion.

9. The method of manufacturing the integrated circuit according to claim 7, further comprising:
depositing at least a film on the substrate after measuring the overlay of the second layer lithography pattern and the target portion.

10. The method of manufacturing the integrated circuit according to claim 1, wherein each of the exposure fields comprises at least one alignment mark.

11. The method of manufacturing the integrated circuit according to claim 10, wherein each of the exposure fields only has one single alignment mark.

12. The method of manufacturing the integrated circuit according to claim 10, further comprising:
measuring the alignment mark of each exposure field to obtain alignment data for the respective exposure field by the measuring system before exposing the substrate.

13. The method of manufacturing the integrated circuit according to claim 12, further comprising:
feeding the alignment data to form the second layer lithography pattern.

14. The method of manufacturing the integrated circuit according to claim 13, wherein the first overlay data and the alignment data are utilized with the different weightings to form the second layer lithography pattern.

15. The method of manufacturing the integrated circuit according to claim 13, wherein the first overlay data, the alignment data and an alignment data of the second layer lithography pattern are utilized with the different weightings to form the second layer lithography pattern.

16. The method of manufacturing the integrated circuit according to claim 1, wherein the directions comprise a first direction and a second direction.

17. The method of manufacturing the integrated circuit according to claim 16, wherein the first direction is orthogonal to the second direction.

* * * * *